(12) United States Patent
Yun et al.

(10) Patent No.: US 8,004,885 B2
(45) Date of Patent: Aug. 23, 2011

(54) THREE-DIMENSIONAL MEMORY DEVICE AND DRIVING METHOD THEREOF

(75) Inventors: Jong-In Yun, Seoul (KR); Jae-Hoon Jang, Seongnam-si (KR); Soon-Moon Jung, Seongnam-si (KR); Han-Soo Kim, Suwon-si (KR); Jun-Beom Park, Suwon-si (KR); Jae-Hun Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 139 days.

(21) Appl. No.: 12/418,821

(22) Filed: Apr. 6, 2009

(65) Prior Publication Data

US 2009/0251962 A1    Oct. 8, 2009

(30) Foreign Application Priority Data

Apr. 7, 2008  (KR) .................. 10-2008-0032261

(51) Int. Cl.
*G11C 16/04* (2006.01)
(52) U.S. Cl. .................. 365/185.02; 365/185.17
(58) Field of Classification Search ........... 365/185.02, 365/185.18, 185.17
See application file for complete search history.

(56) References Cited

U.S. PATENT DOCUMENTS

| 6,856,572 | B2 | 2/2005 | Scheuerlein et al. |
| 7,233,522 | B2 | 6/2007 | Chen et al. |
| 7,505,314 | B2* | 3/2009 | Isobe et al. ............... 365/185.03 |
| 7,518,921 | B2* | 4/2009 | Maejima et al. ......... 365/185.17 |
| 7,782,673 | B2* | 8/2010 | Maejima et al. ......... 365/185.15 |
| 2009/0168482 | A1* | 7/2009 | Park et al. ..................... 365/51 |
| 2009/0168534 | A1* | 7/2009 | Park et al. ............... 365/185.17 |

FOREIGN PATENT DOCUMENTS

| KR | 1020000005160 | 1/2000 |
| KR | 100673019 | 1/2007 |

OTHER PUBLICATIONS

English Abstract for Publication No. 1020000005160, Date of filing: Apr. 7, 2008.
English Abstract for Publication No. 100673019, Date of filing: Dec. 12, 2005.

\* cited by examiner

*Primary Examiner* — Pho M Luu
(74) *Attorney, Agent, or Firm* — F. Chau & Associates, LLC

(57) ABSTRACT

A driving method of a three-dimensional memory device having a plurality of layers is provided. One of the layers is selected. A well of the selected layer is biased with a first well voltage. A word line voltage is applied to a selected word line of the selected layer. A well of an unselected layer is biased with a second well voltage higher than the first well voltage.

20 Claims, 6 Drawing Sheets

Fig. 3

| Signal | Program |
|---|---|
| Select W/L | Vpgm |
| Unselect W/L | Vpass |
| Select B/L | 0 |
| Unselect B/L | Vcc |
| SSL1(1$^{st}$ Layer) | Vcc |
| SSL2(2$^{nd}$ Layer) | 0 |
| GSL1(1$^{st}$ Layer) | 0 |
| GSL2(2$^{nd}$ Layer) | 0 |
| CSL | 1.5 |
| PP-Well — 1st Layer | Vppw1(0V) |
| PP-Well — 2nd Layer | Vppw2 |

US 8,004,885 B2

THREE-DIMENSIONAL MEMORY DEVICE AND DRIVING METHOD THEREOF

CROSS-REFERENCE TO RELATED APPLICATION

This application claims priority to and the benefit of Korean Patent Application No. 10-2008-0032261 filed on Apr. 7, 2008 at the Korean Intellectual Property Office, the entire content of which is incorporated herein by reference.

BACKGROUND

The present invention relates to memory devices, and, more particularly, to a three-dimensional (3D) memory device and its driving method.

With the advance of semiconductor fabricating techniques, high-density memories have been increasingly in demand. Various approaches have been proposed to satisfy such demands. One of the approaches is a memory device with a 3D array structure (hereinafter, referred to as a 3D memory device).

The 3D memory device typically includes memory cell arrays which are formed in multiple semiconductor material layers. The semiconductor material layers typically include a well-known silicon substrate and substrates sequentially stacked on the silicon substrate. The stacked substrates, for example, are typically formed by the use of epitaxial process techniques.

SUMMARY OF THE INVENTION

In accordance with exemplary embodiments of the present invention, a 3D memory device is provided which is capable of reducing program disturbance.

Further in accordance with exemplary embodiments of the present invention, a driving method of a 3D memory device having a plurality of layers is provided. One of the layers is selected. A well of the selected layer is biased with a first well voltage. A word line voltage is applied to a selected word line of the selected layer. A well of unselected layers is biased with a second well voltage higher than the first well voltage.

Still further in accordance with exemplary embodiments of the present invention, a 3D memory device is provided which includes a first memory array formed on a first layer. A second memory array is formed on a second layer. A well driver independently applies well voltages to the first and second layers.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures:

FIG. 3 is a diagram showing bias conditions at a program operation of the 3D memory device illustrated in FIG. 1;

DETAILED DESCRIPTION

Exemplary embodiments of a 3D memory device in accordance with the present invention may be configured such that different well voltages are applied to respective layers. In particular, a well of a program-inhibited layer may be supplied with a voltage higher by a given voltage than that of a layer to be programmed. This enables program disturbance to be reduced at a program operation by means of a program method of a 3D memory device in accordance with at least one exemplary embodiment of the present invention.

Figure 1:
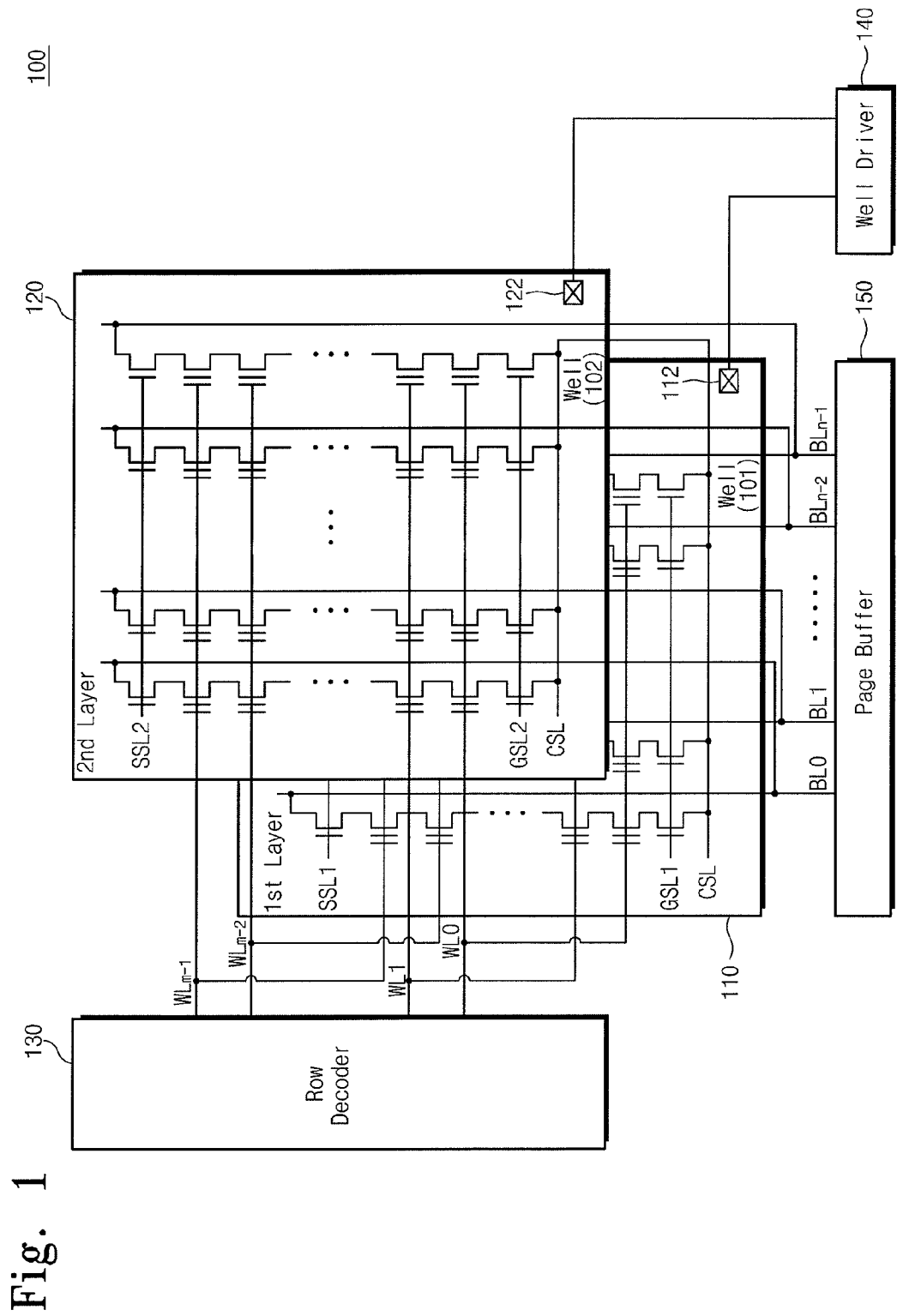
FIG. 1 is a diagram showing a 3D memory device in accordance with an exemplary embodiment of the present invention.

Referring to FIG. 1, a 3D memory device 100 may include a first memory array 110, a second memory array 120, a row decoder 130, a well driver 140, and a page buffer 150. The well driver 140 in accordance with an exemplary embodiment of the present invention may be realized to apply different well voltages to wells 101, 102 of respective layers at a program operation.

The first memory array 110 is a memory cell array formed on the first layer, and the second memory array 120 is a memory cell array formed on the second layer. The first and second memory arrays 110, 120 may be one selected from a group of flash memory array, ROM array, SRAM array, Silicon-Oxide-Nitride-Oxide-Silicon (SONOS) memory array, and the like. Below, for convenience of description, exemplary embodiments of the present invention will be described under the assumption that the memory cells are a NAND flash memory array as illustrated in FIG. 1.

The first and second memory arrays 110, 120 may be a storage region for storing information. The first memory cell array 110 may include plural bit lines BL0 to BLn-1, plural word lines WL0 to WLm-1, and plural memory cells arranged at intersections of the bit lines BL0 to BLn-1 and the word lines WL0 to WLm-1. The first memory array 110 may be formed of a plurality of memory blocks. In FIG. 1, only one memory block is illustrated. Each of the memory blocks of the first memory array 110 may include a plurality of cell strings. As illustrated in FIG. 1, each string may include a plurality of, for example, m memory cells.

Each of the strings may include a plurality of charge storage layers (not shown). The charge storage layers are connected in series between a string select transistor and a ground select transistor in each string. The word lines WL0 to WLm-1 intersect with the strings. The word lines WL0 to WLm-1 are connected to control gates of charge storage layers corresponding to each string. It is possible to program/read data in/from selected charge storage layers by applying a program/read voltage to a selected word line. Further, the second memory array 120 is configured to be substantially similar in structure with the first memory array 110.

Still referring to FIG. 1, the 3D memory device 100 may include a plurality of NAND strings connected to one bit line. The NAND strings have string select lines SSL1, SSL2 and ground select lines GSL1, GSL2, respectively. Further, the NAND strings share a common source line CSL. The first memory array 110 and the second memory array 120 share the word lines WL0 to WLm-1. The well 101 of the first memory array 110 is connected to the well driver 140 via a contact 112, and the well 102 of the second memory array 120 is connected to the well driver 140 via a contact 122.

The row decoder 130 may select word lines according to an address input at a program or read operation. At a program operation, a program voltage Vpgm is applied to a selected word line, and a pass voltage Vpass is applied to unselected word lines. Herein, the program voltage Vpgm and the pass voltage Vpass may be provided from a word line voltage generator (not shown).

The well driver 140 biases the wells 101, 102 of the first and second memory arrays 110, 120, respectively. In particular, the well driver 140 may be realized such that well voltages are applied to the wells 101, 102 independently. For example, in a case where a program operation is executed at the first memory array 110, the well driver 140 applies a voltage of 0V to the well 101 and a voltage between 0V and 1V to the well 102.

The page buffer 150 temporarily stores data loaded on the memory arrays 110, 120 at a program operation and data read out from the memory arrays 110, 120 at a read operation. The page buffer 150 is connected to the memory array 110, 120 via the bit lines BL0 to BLn-1. The page buffers 150 may include a plurality of latches (not shown) corresponding to the bit lines, respectively. Each of the latches stores program data or read data.

The page buffer 150 applies a ground voltage 0V or a power supply voltage Vcc according to data stored in respective latches at a program operation. For example, a ground voltage is applied to a bit line connected with a latch storing data of '0', that is, a bit line connected with a memory cell to be programmed. A power supply voltage Vcc is applied to a bit line connected with a latch storing data of '1', that is, a bit line connected with a memory cell to be program inhibited.

The 3D memory device illustrated in FIG. 1 includes two layers. However, those skilled in the art would appreciate that the exemplary embodiment of the present invention is not limited to a two layer embodiment. For example, the 3D memory device in accordance with an exemplary embodiment of the present invention may be formed to have three or more layers.

The 3D memory device 100 in accordance with the exemplary embodiment of the present invention may include a contact structure where well voltages are independently applied to corresponding wells of respective layers. This will be more fully described below with reference to FIG. 4.

Figure 2:
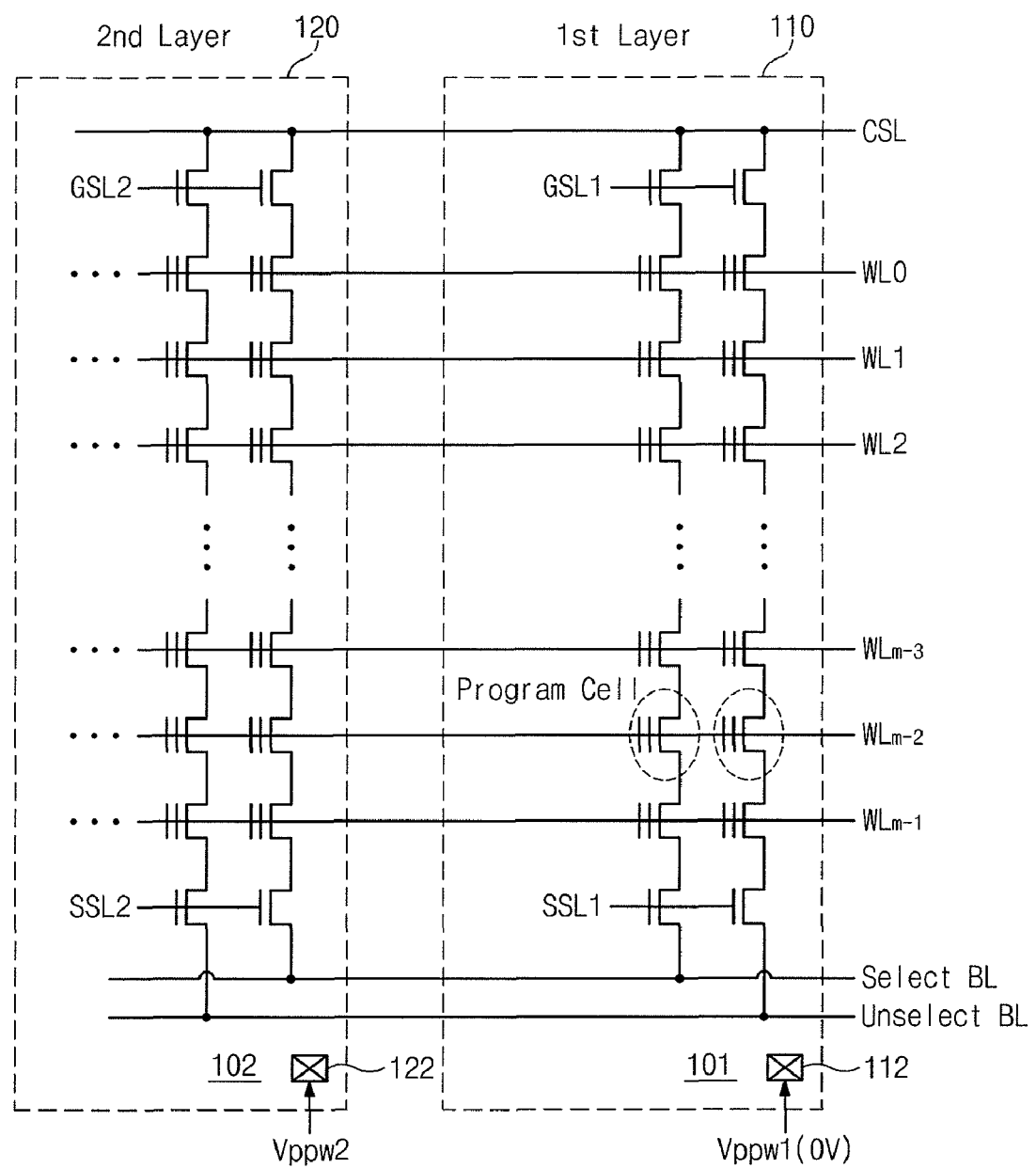
FIG. 2 is a diagram for describing the reduction of program disturbance of the 3D memory device illustrated in FIG. 1.

FIG. 2 is a diagram for describing the reduction of program disturbance of a 3D memory device illustrated in FIG. 1. FIG. 3 is a diagram showing a bias condition at a program operation of a 3D memory device illustrated in FIG. 1. The reason that program disturbance is reduced at a program operation will be described below with reference to FIGS. 2 and 3.

For convenience of description, it is assumed that memory cells of the first memory array 110 connected with a word line WLm-2 are programmed. A program voltage Vpgm is applied to a selected word line WLm-2, a pass voltage Vpass is applied to unselected word lines WL0 to WLm-3 and WLm-1, a voltage of 0V is applied to a selected bit line, and a power supply voltage is applied to unselected bit lines. At this time, a power supply voltage is applied to the first string select line SSL1, and a voltage of 0V is applied to the second string select line SSL2. A voltage of 0V is applied to the first and second GSL1, GSL2, a voltage of 1.5V is applied to a common source line CSL, the first well voltage Vppw1 (e.g., 0V) is applied to a well 101 of the first layer via a contact 112, and the second well voltage Vppw2 is applied to a well 102 of the second layer via a contact 122. Herein, the second well voltage Vppw2 is higher than the first well voltage Vppw1 (e.g., 0V).

In a conventional 3D memory device, when there are programmed memory cells of the first memory array 110 connected with a word line WLm-2, a program voltage Vpgm is applied to a shared word line WLm-2, and a voltage of 0V is applied to the well 102 of the second layer. As such, there is increased the probability that memory cells of the second memory array 120 connected with the word line WLm-2 are programmed. Such unintended programming is commonly known as program disturbance.

On the other hand, in the case of the 3D memory device in accordance with the exemplary embodiment of the present invention, when memory cells of the first memory array 110 connected with the word line WLm-2 are programmed, a program voltage is applied to a shared word line WLm-2, and the second well voltage Vppw2 is applied to the well 102 of the second layer. Herein, the well voltage Vppw2 is higher than 0V. Thus, the probability that memory cells of the second memory array 120 connected with the word line WLm-2 are programmed, may be reduced as compared with the conventional case. This makes program disturbance of the 3D memory device in accordance with an exemplary embodiment of the present invention less likely.

Figure 4:
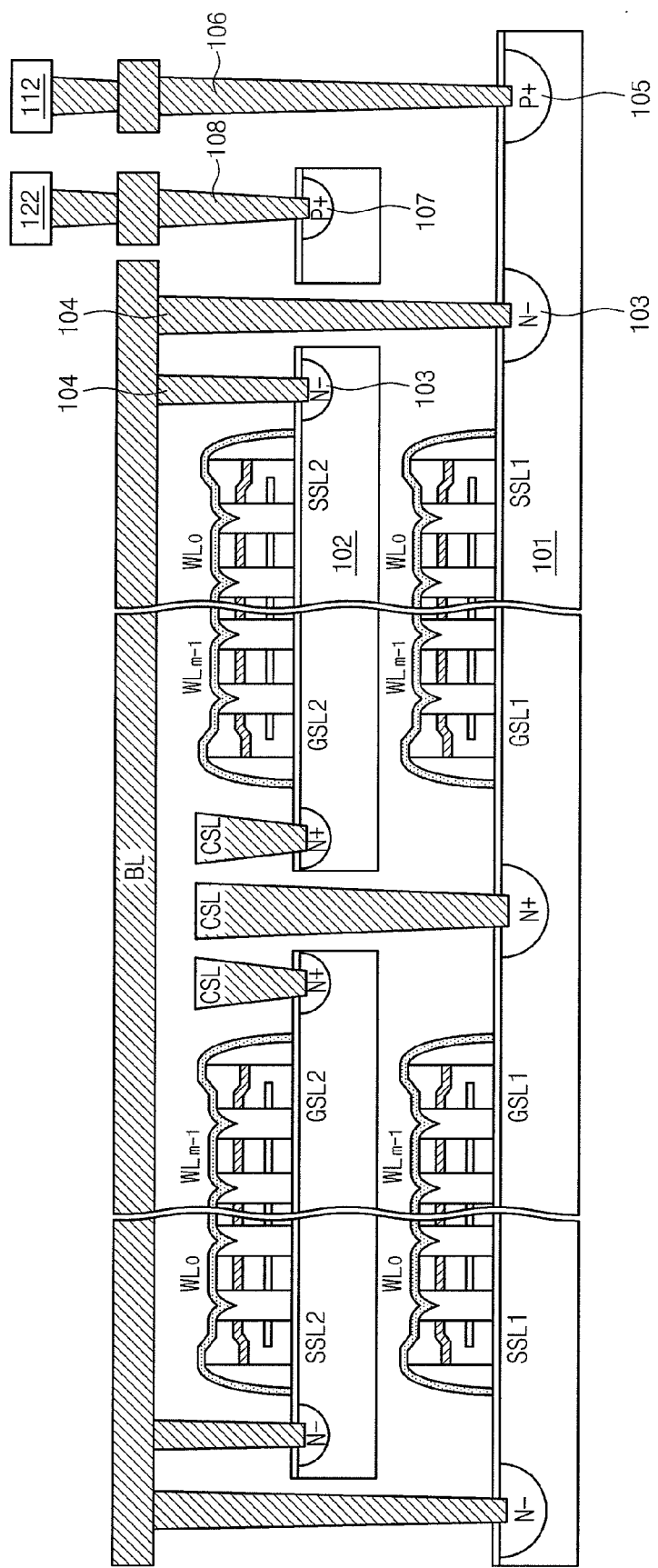
FIG. 4 is a diagram showing a cross-sectional view of the 3D memory device in accordance with an exemplary embodiment of the present invention.

FIG. 4 is a diagram showing a cross-sectional view of a 3D memory device in accordance with an exemplary embodiment of the present invention. Referring to FIG. 4, the 3D memory device 100 may include contacts 112, 122 for applying well voltages to wells 101, 102 independently. The first and second layers of the 3D memory device 100 in accordance with an exemplary embodiment of the present invention may be separated by an interlayer insulation film.

Bit line contact holes 104 are formed on an impurity injection region 103, which is doped by N− as illustrated in FIG. 4. Wells 101, 102 are doped by P+. Thus, PN junctions are formed between the impurity injection region 103 and the wells 101, 102. For this reason, the well voltage Vppw2 of the 3D memory device illustrated in FIG. 4 may be set to have a voltage between 0V and 1V. This prevents the PN junctions from being broken down.

Well contact holes 106, 108 are formed on impurity injection regions 105, 107, respectively. Herein, the impurity injection regions 105, 107 are doped by P+. Although not shown in the figures, well contacts 112, 122 are disposed between the bit lines so as to be spaced apart from each other.

As described above, the 3D memory device 100 in accordance with an exemplary embodiment of the present invention may be configured such that wells of the layers are biased independently.

Figure 5:
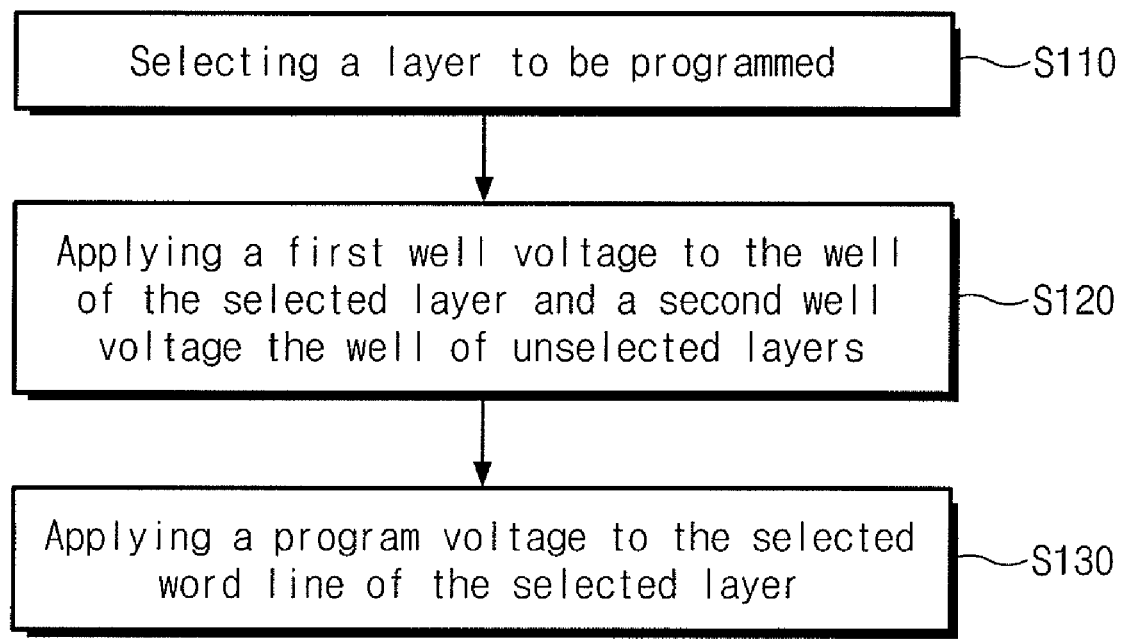
FIG. 5 is a diagram showing a program method of the 3D memory device in accordance with an exemplary embodiment of the present invention.

FIG. 5 is a diagram showing a program method for a 3D memory device in accordance with an exemplary embodiment of the present invention. The program method of the 3D memory device will be more fully described with reference to FIGS. 3 to 5.

The 3D memory device 100 may select a layer to be programmed in response to an externally input address at a program operation (S110). For convenience of description, it is assumed that memory cells connected with a word line WLm-2 of the first layer in FIG. 1 are programmed. A row decoder 130 may select the word line WLm-2 according to the input address. Data to be stored in the first memory array 110 is loaded on a page buffer 150. Such data may be stored in the first memory array 110 via respective bit lines BL0 to BLn-1.

To program the first memory array 110, a power supply voltage Vcc is applied to the first string select line SSL1, and a voltage of 0V is applied to the first ground select line GSL1. So as to prevent the second memory array 120 from being programmed, a voltage of 0V is applied to the second string select line SSL2, and a voltage of 0V is applied to the second ground select line GSL2. Further, a voltage of 1.5V is applied to a common source line CSL.

A well driver 140 applies the first well voltage Vppw1 to a well 101 of the first layer and the second well voltage Vppw2 to a well of the second layer (S120). Herein, the first well voltage Vppw1 is 0V, and the second well voltage Vppw2 is a voltage higher than the first well voltage Vppw1 and lower than 1V. In particular, the second well voltage Vppw2 may be a voltage sufficient to prevent PN junctions between well 101 and impurity rejection region 103 and between well 102 and impurity injection region 103, as illustrated in FIG. 4.

A program voltage Vpgm is applied to the selected word line WLm-2 by the row decoder 130 (S130). A pass voltage Vpass is applied to unselected word lines WL0 to WLm-3 and WLm-1. A program operation is then completed.

As described above, the 3D memory device 100 in accordance with the exemplary embodiment of the present invention may be configured such that different well voltages are applied to wells 101, 102 at a program operation. Further, the 3D memory device 100 in accordance with the exemplary embodiment of the present invention may be configured such that different well voltages are applied to wells 101, 102 at a read operation. Thus, it is possible to reduce read disturbance at a read operation. On the other hand, the 3D memory device 100 in accordance with the exemplary embodiment of the present invention may be configured such that the same well voltage is applied to the wells 101, 102 at an erase operation.

Figure 6:
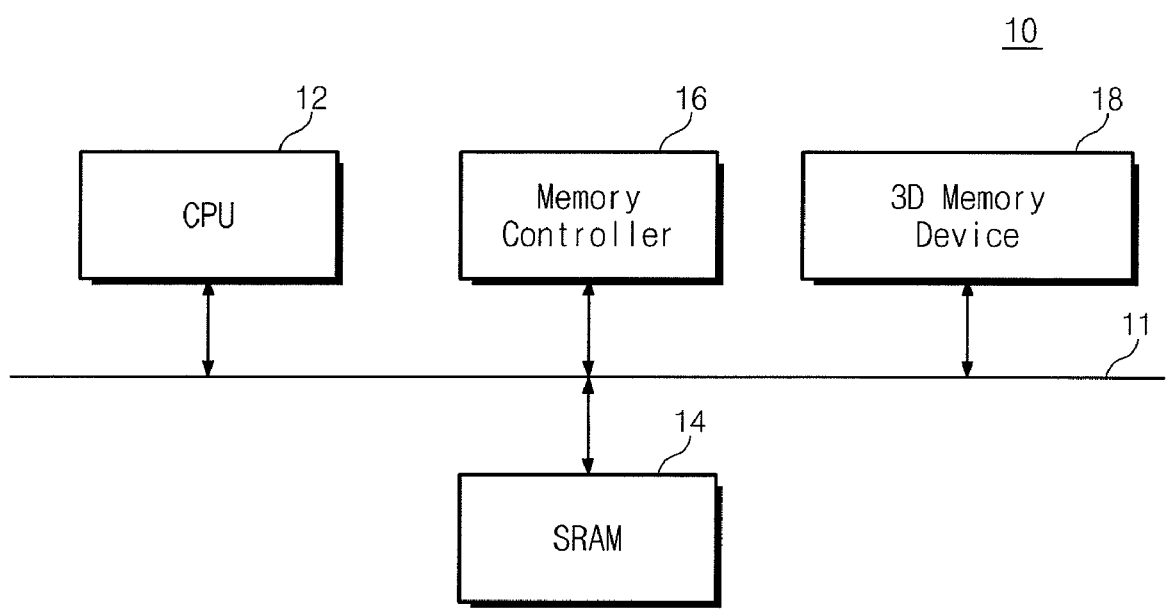
FIG. 6 is a diagram showing a memory system including an exemplary 3D memory device in accordance with an exemplary embodiment of the present invention.

FIG. 6 is a diagram showing a memory system including a 3D memory device in accordance with an exemplary embodiment of the present invention. Referring to FIG. 6, a memory system 10 may include CPU 12, SRAM 14, a memory controller 16, and a 3D memory device 18 which are electrically connected to a bus 11. Herein, the 3D memory device 18 is configured substantially similar to that illustrated in FIG. 1. N-bit data (N being 1 or more integers) processed/to be processed by the CPU 12 is stored in the 3D memory device 18 via the memory controller 16.

Although not shown in figures, the memory system 10 in accordance with the exemplary embodiment of the present invention further includes application chipsets, camera image processors, mobile DRAM, and the like. The memory controller and the 3D memory device, for example, may constitute Solid State Disk (SSD) that uses non-volatile memory devices for storing data.

It is possible to pack the 3D memory device and/or the memory controller in accordance with an exemplary embodiment of the present invention with various types of packages. For example, the 3D memory device and/or the memory controller in accordance with an exemplary embodiment of the present invention may be packed by one selected from a group of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

The above-disclosed subject matter is to be considered illustrative, and not restrictive, and the appended claims are intended to cover all such modifications, enhancements, and other embodiments, which fall within the true spirit and scope of the present invention. Thus, the scope of the present invention is to be determined by the broadest permissible interpretation of the following claims and their equivalents, and shall not be restricted or limited by the foregoing detailed description.

What is claimed is:

1. A driving method of a three-dimensional memory device having a plurality of layers, each layer having selectable word lines, the driving method comprising:
   selecting one of the layers to provide a selected layer;
   biasing a well of the selected layer with a first well voltage;
   applying a word line voltage to a selected word line of the selected layer; and
   biasing a well of unselected layers with a second well voltage higher than the first well voltage
   wherein each of the plurality of layers forms a respective memory array layer, the memory array layers being stacked and overlapping each other.

2. The driving method of claim 1, wherein the layers share the selectable word lines.

3. The driving method of claim 1, wherein the selecting occurs in response to an address input during a read operation.

4. The driving method of claim 1, wherein the selecting occurs in response to an address input during a program operation.

5. The driving method of claim 4, wherein the first well voltage is 0V and the second well voltage is higher than 0V and lower than 1V.

6. A three-dimensional memory device comprising:
   a first memory array on a first layer, the first memory array having selectable first layer word lines, the first layer having a first layer well;
   a second memory array on a second layer, the second memory array having selectable second layer word lines, the second layer having a second layer well; and
   a well driver that independently applies well voltages to the first layer well and to the second layer well,
   wherein the first memory array on the first layer and the second memory array on the second layer are stacked and overlap each other.

7. The three-dimensional memory device of claim 6, wherein the selectable first layer word lines and the selectable second layer word lines share common word lines.

8. The three-dimensional memory device of claim 6, wherein at a program operation the well driver applies different voltages to the first layer well and to the second layer well.

9. The three-dimensional memory device of claim 8, wherein at a program operation the well driver applies a voltage of 0V to a well of a layer being programmed and a voltage higher than 0V and lower than 1V to a well of a layer being program inhibited.

10. The three-dimensional memory device of claim 6, wherein at a read operation the well driver applies different voltages to the first layer well and to the second layer well.

11. The three-dimensional memory device of claim 6, wherein at an erase operation the well driver applies the same voltage to the first layer well and to the second layer well.

12. A method of reducing program disturbance between multiple layers of a three-dimensional memory device, the multiple layers sharing common selectable word lines, each layer having a well, the method comprising:
   applying a program voltage to a selectable word line of a first layer shared with a selectable word line of a second layer;
   applying a pass voltage to unselected word lines;
   applying a first layer well voltage to a first layer well; and
   applying a second layer well voltage to a second layer well, wherein the second layer well voltage is greater than the first layer well voltage, and wherein each of the multiple layers forms a respective memory array layer, the memory array layers being stacked and overlapping each other.

13. The method of claim 12, wherein applying a program voltage further comprises providing the program voltage from a row decoder in response to an address input at a program operation.

14. The method of claim 12,
wherein applying a first layer well voltage further comprises biasing the first layer well from a well driver; and
wherein applying a second layer well voltage further comprises biasing the second layer well from the well driver.

15. The method of claim 12, further comprising forming memory cells at intersections of the word lines and bit lines.

16. The method of claim 15, wherein a string of the memory cells is connected to a bit line responsive to program data from a page buffer.

17. A three-dimensional memory device, comprising:
at least a first memory array layer and a second memory array layer, each layer sharing common selectable word lines, each layer having a well;
a row decoder that provides a selection voltage that selects a word line and a unselection voltage that inhibits word lines, in response to an address input data at a program operation or a read operation;
a well driver that applies a first memory array layer well voltage to a first memory array well and that applies a second memory array layer well voltage to a second memory array layer well, the second memory array layer well voltage being greater than the first memory array layer well voltage; and
a page buffer having bit lines intersecting word lines to provide memory cells, a string of the memory cells being connected to a bit line, the page buffer being responsive to program data of the program operation or read data of the read operation.

18. The three-dimensional memory device of claim 17, wherein the first memory array layer well voltage is 0V and the second memory array layer well voltage is higher than 0V but lower than 1V.

19. The three-dimensional memory device of claim 17, wherein the at least first memory array layer and the second memory array layer are substantially similar.

20. The three-dimensional memory device of claim 17, wherein the string is a NAND string.

* * * * *